(12) United States Patent
Chien

(10) Patent No.: US 11,018,634 B2
(45) Date of Patent: May 25, 2021

(54) AUDIO CODEC CIRCUIT AND METHOD FOR PROCESSING AUDIO DATA

(71) Applicant: REALTEK SEMICONDUCTOR CORP., Hsinchu (TW)

(72) Inventor: Chih-Kang Chien, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/922,225

(22) Filed: Jul. 7, 2020

(65) Prior Publication Data

US 2021/0013845 A1  Jan. 14, 2021

(30) Foreign Application Priority Data

Jul. 8, 2019  (TW) .................. 108124024

(51) Int. Cl.
*H03F 1/32* (2006.01)
*H03M 1/12* (2006.01)
*H03M 1/66* (2006.01)

(52) U.S. Cl.
CPC ............ *H03F 1/3264* (2013.01); *H03M 1/12* (2013.01); *H03M 1/66* (2013.01); *H03F 2200/03* (2013.01)

(58) Field of Classification Search
CPC ...... G10L 21/0208; G10L 2021/02165; H04R 3/005; H04R 3/002; H04R 2410/07; H04R 3/00; H04R 3/04; H03F 1/36; H03F 1/34; H03F 1/347; H03F 1/32; H03F 1/3241; H03F 1/3247; H03F 1/3264; H03F 3/217; H03F 3/38; H03F 3/181; H03F 3/72; H03F 3/187; H03F 2200/03; H03M 1/12; H03M 1/66; H04F 2200/03; H03G 3/3005; G11B 20/24
USPC ........................................ 381/120, 121, 94.1
See application file for complete search history.

(56) References Cited

U.S. PATENT DOCUMENTS

| | | | |
|---|---|---|---|
| 10,249,283 B2 * | 4/2019 | Zhou ................. | G10K 11/17835 |
| 2003/0063736 A1 * | 4/2003 | King ....................... | H04M 9/08 |
| | | | 379/406.01 |
| 2008/0049950 A1 * | 2/2008 | Poletti ...................... | H04R 3/00 |
| | | | 381/94.2 |
| 2017/0288690 A1 * | 10/2017 | Shen ....................... | H03M 1/066 |
| 2018/0212570 A1 * | 7/2018 | Zhu ......................... | H03F 1/3247 |

(Continued)

FOREIGN PATENT DOCUMENTS

| | | |
|---|---|---|
| CN | 105612766 A | 5/2016 |
| TW | 201923739 A | 6/2019 |

*Primary Examiner* — Ahmad F. Matar
*Assistant Examiner* — Sabrina Diaz
(74) *Attorney, Agent, or Firm* — Birch, Stewart, Kolasch & Birch LLP

(57) ABSTRACT

A circuit includes a digital-to-analog conversion circuit, an amplifying circuit, a mixing circuit, and an analog-to-digital converter. The digital-to-analog conversion circuit is configured to receive and convert audio data in the digital domain and output audio data in the analog domain. The audio data includes a main-tone component. The amplifying circuit is configured to output an audio signal according to the audio data in the analog domain. The mixing circuit is configured to eliminate the main-tone component according to the audio data in the analog domain and the audio signal and to output a feedback signal. The analog-to-digital converter is configured to convert the feedback signal from the analog domain to the digital domain.

19 Claims, 11 Drawing Sheets

(56) References Cited

U.S. PATENT DOCUMENTS

2018/0351515 A1* 12/2018 Lesso et al. .......... H03F 1/0205
2018/0351523 A1* 12/2018 Lesso ..................... H03F 3/187
2018/0376246 A1* 12/2018 Howlett ................. H03F 3/187

* cited by examiner

AUDIO CODEC CIRCUIT AND METHOD FOR PROCESSING AUDIO DATA

CROSS-REFERENCE TO RELATED APPLICATION

This non-provisional application claims priority under 35 U.S.C. § 119(a) to Patent Application No. 108124024 in Taiwan, R.O.C. on Jul. 8, 2019, the entire contents of which are hereby incorporated by reference.

BACKGROUND

Technical Field

The present invention relates to an audio processing technology, and in particular, to an audio CODEC circuit and a method for processing audio data.

Related Art

As audio related product competes on sound quality, the characteristic of Hi-Fi audio is gradually becoming a must-have specification for audio CODEC. The audio CODEC not only demands a very high signal to noise ratio (SNR) in order to achieve absolute quietness when muting, but also becomes increasingly demanding with harmonic distortion specifications for large signals. After an audio signal (or audio data) is transformed into energy of each frequency through fast Fourier transform (FFT), it can be found that after a single audio signal is processed by various non-linear systems, an output audio signal may have harmonic energy generated (referred to as harmonic distortion). In addition, a value of total harmonic distortion (THD) can be used for quantifying the suppression of the harmonic distortion in a linear system. The total harmonic distortion is defined as a ratio of main signal energy to the integral of all harmonic energy. An audio CODEC of poor total harmonic distortion may make sounds that could have been played clearly blurred together due to the influence of harmonics, affecting the overall sound quality.

SUMMARY

In an embodiment, a circuit includes: a digital-to-analog conversion circuit, an amplifying circuit, a mixing circuit, and an analog-to-digital converter. The digital-to-analog conversion circuit is configured to receive and convert audio data in the digital domain and output audio data in the analog domain. The audio data includes a main-tone component. The amplifying circuit is configured to output an audio signal according to the audio data in the analog domain. The mixing circuit is configured to eliminate the main-tone component according to the audio data in the analog domain and the audio signal and to output a feedback signal. The analog-to-digital converter is configured to convert the feedback signal from the analog domain to the digital domain.

In an embodiment, a method for processing audio data includes: converting audio data in the digital domain to audio data in the analog domain; outputting an audio signal according to the audio data in the analog domain; eliminating a main-tone component according to the audio data in the analog domain and the audio signal to output a feedback signal; and converting the feedback signal from the analog domain to the digital domain.

Based on the above, according to the audio CODEC circuit and the method for processing audio data of the present invention, the main-tone component in the signal is eliminated by using a technology for eliminating a main signal to feed back the harmonic distortion and/or noise in the signal, to adjust or compensate the audio data, thereby effectively guaranteeing the improvement in the sound quality.

DETAILED DESCRIPTION

With respect to the "coupling" or the "connection" used herein, it may mean that two or more components are in direct physical or electrical contact with each other, or in indirectly physical or electrical contact, and the "coupling" or the "connection" may also refer to two or more components operate or act together.

Figure 1:
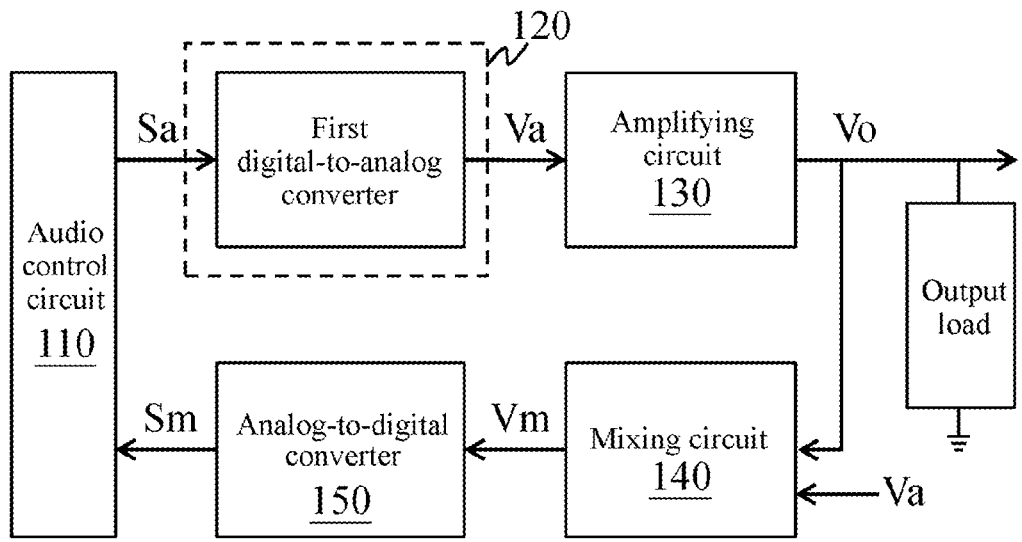
FIG. 1 is a functional block diagram of an audio CODEC circuit according to an embodiment of the present invention.

Referring to FIG. 1, in some embodiments, an audio CODEC circuit includes: a digital-to-analog conversion circuit 120, an amplifying circuit 130, a mixing circuit 140, and an analog-to-digital converter 150. An input of the amplifying circuit 130 is coupled to an output of the digital-to-analog conversion circuit 120. An output of the mixing circuit 140 is coupled to the output of the digital-to-analog conversion circuit 120 and an output of the amplifying circuit 130, and the output of the mixing circuit 140 is coupled to an input of the analog-to-digital converter 150.

Figure 2:
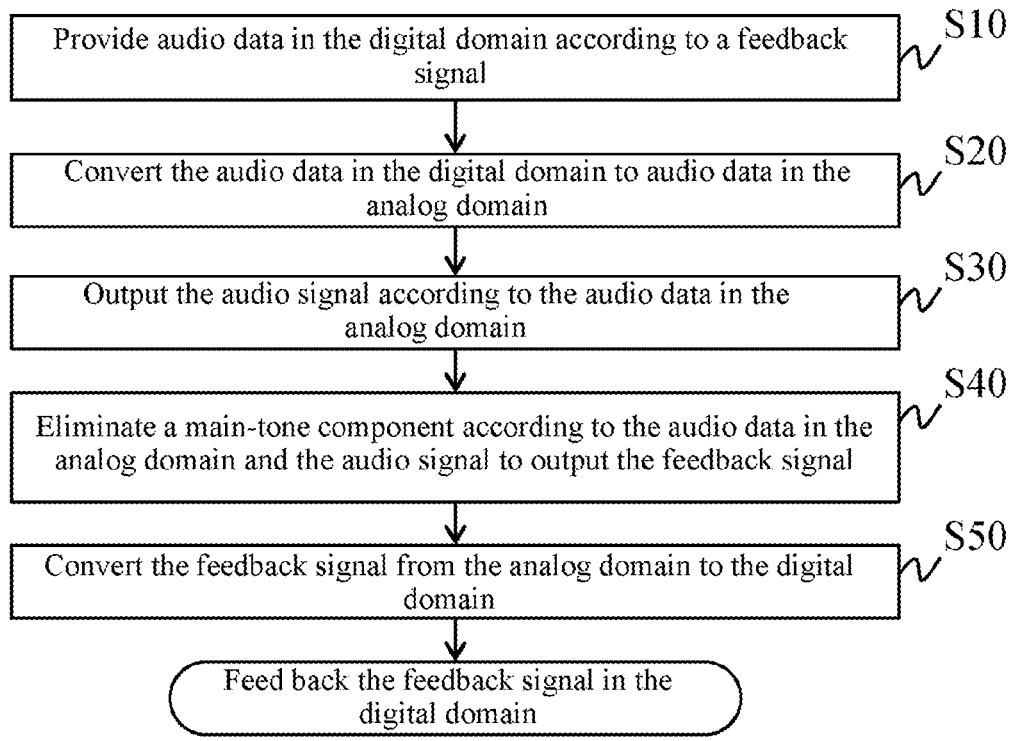
FIG. 2 is a flowchart of a method for processing audio data according to an embodiment of the present invention.

Referring to FIG. 1 and FIG. 2, the digital-to-analog conversion circuit 120 receives audio data Sa in the digital domain and outputs audio data Va in the analog domain. That is, the digital-to-analog conversion circuit 120 converts the audio data Sa in the digital domain to the audio data Va in the analog domain (step S20). The amplifying circuit 130 outputs an audio signal Vo according to the audio data Va in the analog domain (step S30). The audio data Va includes a main-tone component. The audio signal Vo is not only output to a back-end load (not drawn) through an output end, but also output to the mixing circuit 140.

In this case, the mixing circuit 140 eliminates the main-tone component according to the audio data Va in the analog domain and the audio signal Vo to output a feedback signal Vm (step S40). The analog-to-digital converter 150 converts the feedback signal Vm from the analog domain to the digital domain (that is, a feedback signal Sm in the digital domain) (step S50).

In some embodiments, the mixing circuit 140 performs a magnification adjustment and a summation operation on the audio data Va in the analog domain and the audio signal Vo to generate the feedback signal Vm.

In some embodiments, a gain of the mixing circuit 140 is related to a gain of the amplifying circuit 130.

In an embodiment, the audio CODEC circuit may further include an audio control circuit 110. The audio control circuit 110 is coupled to an input of the digital-to-analog conversion circuit 120 and an output of the analog-to-digital converter 150. In this case, the audio control circuit 100 provides audio data Sa in the digital domain according to a feedback signal Sm in the digital domain (step S10). In an example, the audio control circuit 110 receives external audio data and the feedback signal Sm in the digital domain of the analog-to-digital converter 150, and adjusts the audio data according to the feedback signal Sm and further outputs the audio data Sa after adjustment to the digital-to-analog conversion circuit 120 (step S20). For example, the feedback signal Sm in the digital domain can be recorded back by the audio control circuit 110 to adjust the external audio data, or the audio control circuit 110 can generate the audio data Sa based on the feedback signal Sm. In an embodiment, the digital-to-analog conversion circuit 120 can be implemented by a digital-to-analog converter.

Figure 3:
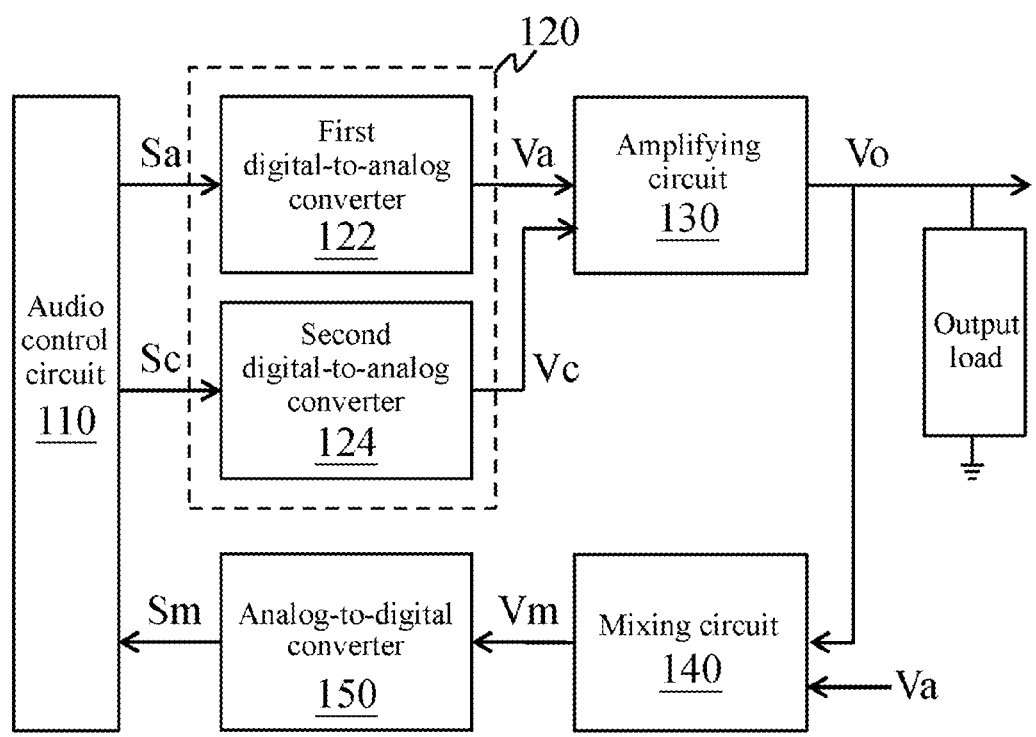
FIG. 3 is a functional block diagram of an audio CODEC circuit according to another embodiment of the present invention.
Figure 4:
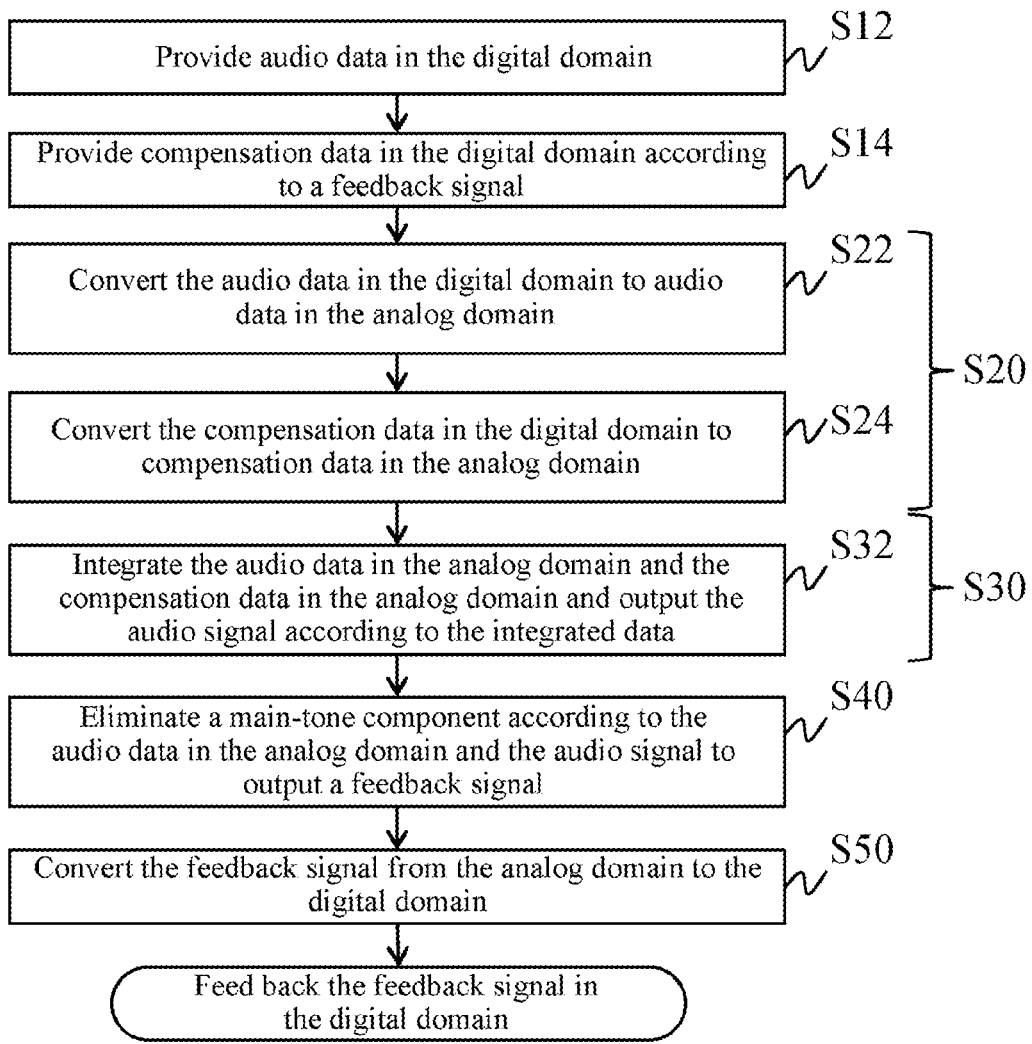
FIG. 4 is a flowchart of a method for processing audio data according to another embodiment of the present invention.

In another embodiment, referring to FIG. 3 and FIG. 4, an audio CODEC circuit may further include an audio control circuit 110, and a digital-to-analog conversion circuit 120 may include two digital-to-analog converters (hereinafter referred to as a first digital-to-analog converter 122 and a second digital-to-analog converter 124). The audio control circuit 110 is coupled to an input of the first digital-to-analog converter 122, an input of the second digital-to-analog converter 124, and an output of an analog-to-digital converter 150. In this case, the audio control circuit 110 provides audio data Sa in the digital domain to the first digital-to-analog converter 122 and provides compensation data Sc in the digital domain to the second digital-to-analog converter 124 according to the feedback signal Sm. That is, the audio control circuit 110 receives external audio data and provides the audio data Sa to the first digital-to-analog converter 122 (step S12). The first digital-to-analog converter 122 further converts the audio data Sa in the digital domain to the audio data Va in the analog domain (step S22), and then provides the audio data Va in the analog domain to the amplifying circuit 130. In addition, the audio control circuit 110 receives a feedback signal Sm in the digital domain of the analog-to-digital converter 150, and provides compensation data Sc in the digital domain to the second digital-to-analog converter 124 according to the feedback signal Sm (step S14). The second digital-to-analog converter 124 further converts the compensation data Sc in the digital domain to the compensation data Vc in the analog domain (step S24), and then provides the compensation data Vc in the analog domain to the amplifying circuit 130. In this case, the amplifying circuit 130 receives the compensation data Vc in the analog domain and the audio data Va in the analog domain, and integrates the compensation data Vc in the analog domain and the audio data Va in the analog domain to generate and output an audio signal Vo.

Figure 5:
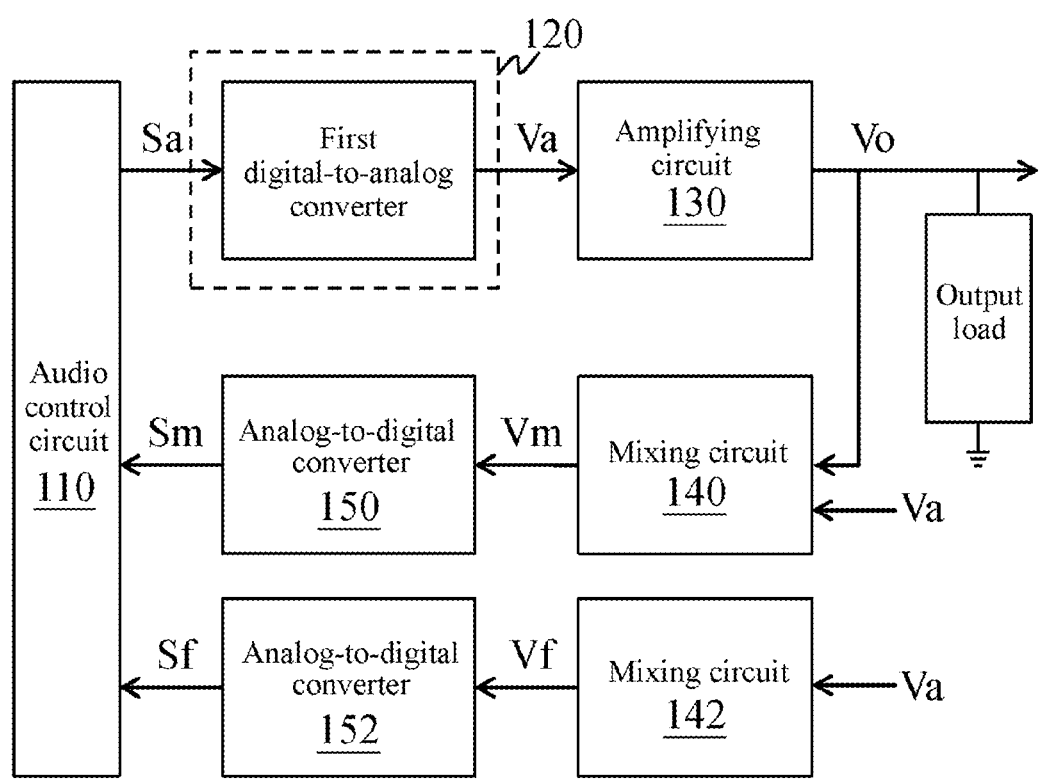
FIG. 5 is a functional block diagram of an audio CODEC circuit according to still another embodiment of the present invention.

In another embodiment, referring to FIG. 5, an audio CODEC circuit may further include another mixing circuit 142 and another analog-to-digital converter 152. The mixing circuit 142 is coupled between an output of a digital-to-analog conversion circuit 120 and an input of the analog-to-digital converter 152. An output of the analog-to-digital converter 152 is coupled to an audio control circuit 110.

Figure 6:
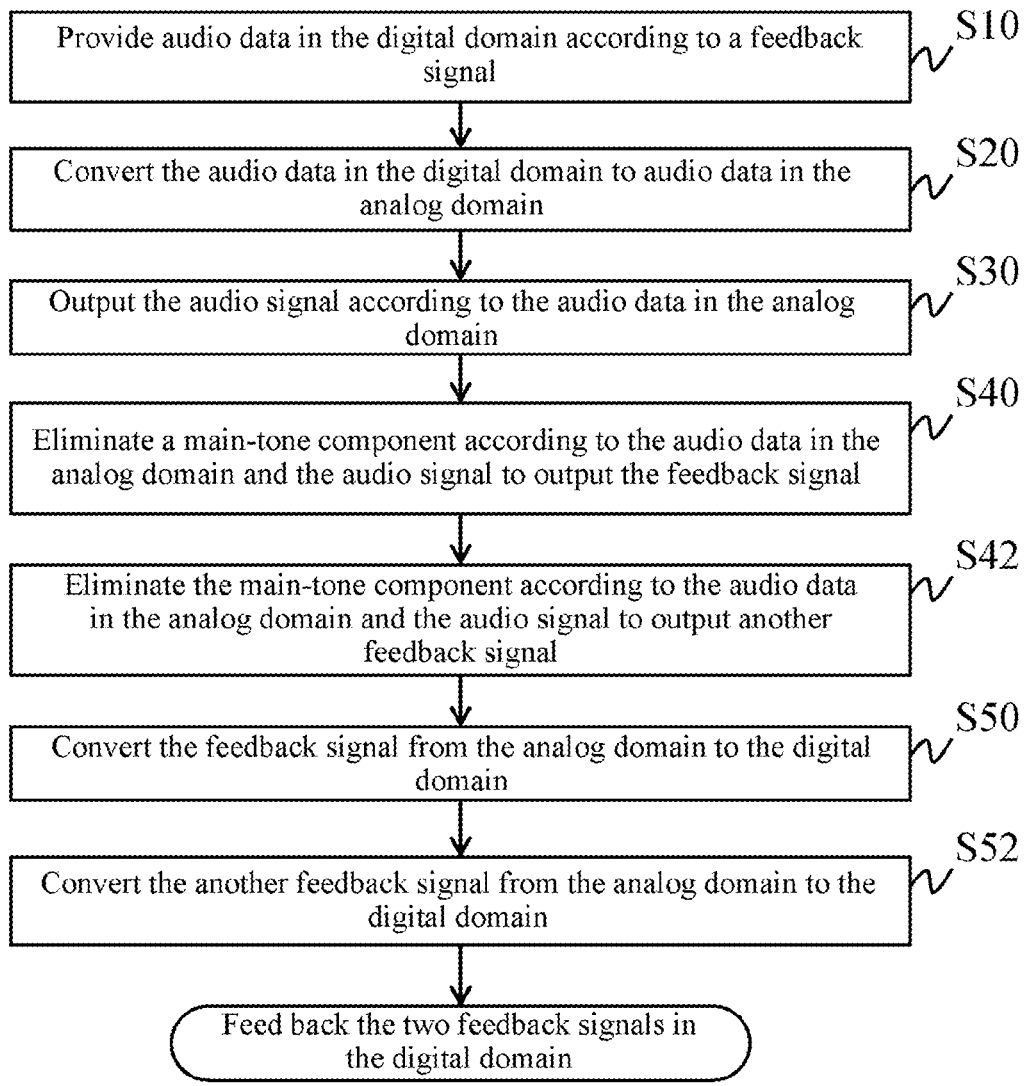
FIG. 6 is a flowchart of a method for processing audio data according to still another embodiment of the present invention.

Referring to FIG. 5 and FIG. 6, the mixing circuit 142 eliminates the main-tone component according to the audio data Va in the analog domain to output another feedback signal Vf (step S42). The analog-to-digital converter 152 converts the another feedback signal Vf from the analog domain to the digital domain (that is, a feedback signal Sf in the digital domain) (step S52).

In an example, the audio control circuit 110 receives external audio data and the feedback signals Sm and Sf in the digital domain of the two analog-to-digital converters 150 and 152, and adjusts the audio data according to the feedback signals Sm and Sf and further outputs the audio data Sa after adjustment to the digital-to-analog conversion circuit 120 (step S10). For example, the feedback signals Sm and Sf in the digital domain can be recorded back by the audio control circuit 110 to adjust the external audio data, or the audio control circuit 110 can generate the compensation data Sc and the audio data Sa based on the feedback signals Sm and Sf.

It should be noted that, although the foregoing steps describe in sequence, however, the order is not limited by the present invention. A person skilled in the art should understand that the order of execution of the partial steps can be simultaneously performed or negotiated in a reasonable case.

In some embodiments, audio data Va in the analog domain and a feedback signal Vm in the analog domain may be in a differential form. That is, referring to FIG. 7, the audio data Va in the analog domain includes first-level audio data Vap and second-level audio data Van, and the feedback signal Vm in the analog domain includes a first-level feedback signal Vmp and a second-level feedback signal Vmn.

Figure 7:
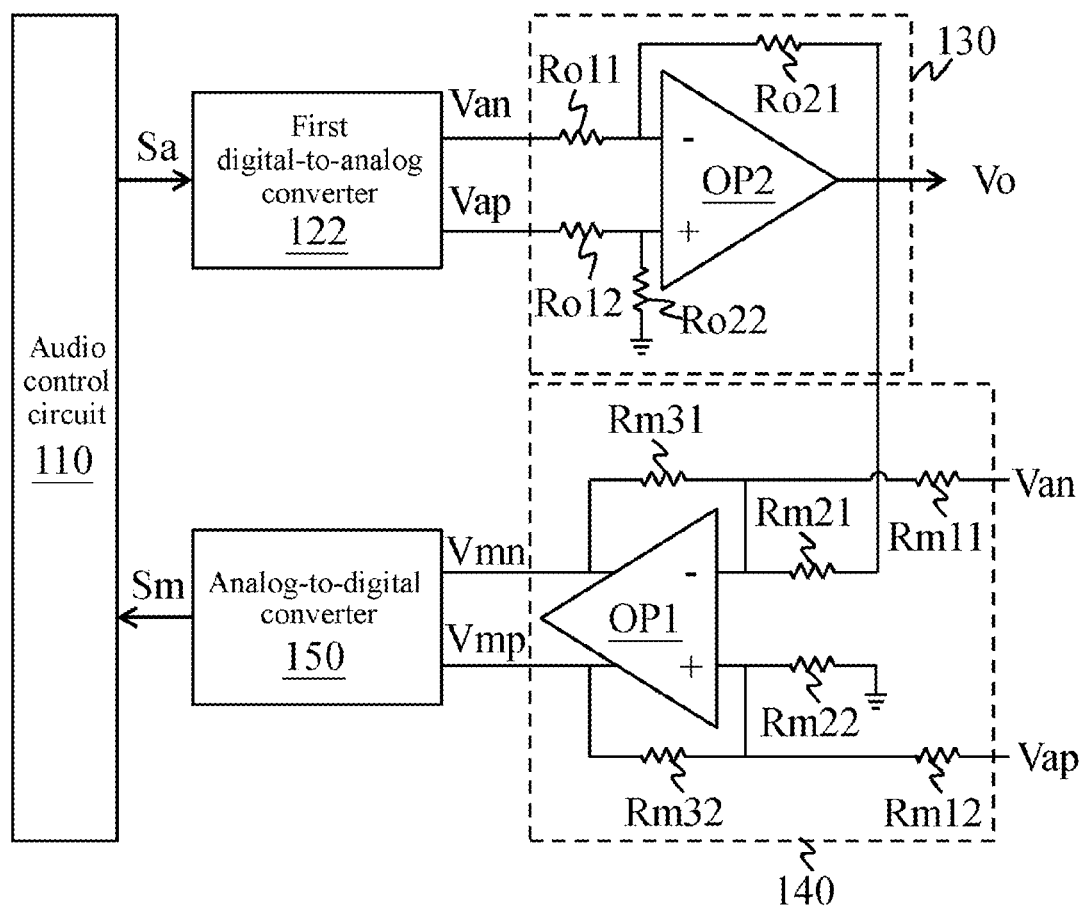
FIG. 7 is a circuit schematic diagram of an example of an amplifying circuit and an example of a mixing circuit.

In an example, referring to FIG. 7, a mixing circuit 140 may include an operational amplifier OP1 and a plurality of resistors, and these resistors include two first resistors Rm11 and Rm12, two second resistors Rm21 and Rm22, and two third resistors Rm31 and Rm32.

The first resistor Rm11 is coupled between an input of the amplifying circuit 130 and an input of the operational amplifier OP1 (such as a negative input end), and receives the second-level audio data Van from the first digital-to-analog converter 122. The first resistor Rm12 is coupled between the input of the amplifying circuit 130 and the input of the operational amplifier OP1 (such as a positive input end), and receives the first-level audio data Vap from the first digital-to-analog converter 122. The second resistor Rm21 is coupled between an output of the amplifying circuit 130 and the input of the operational amplifier OP1 (such as the negative input end), and receives an audio signal Vo. The second resistor Rm22 is coupled between the input of the operational amplifier OP1 (such as the positive input end) and the ground. The third resistor Rm31 is coupled between the input of the operational amplifier OP1 (such as the negative input end) and the output of the operational amplifier OP1 (such as the negative output end). The third resistor Rm32 is coupled between the input of the operational amplifier OP1 (such as the positive input end) and the output of the operational amplifier OP1 (such as the positive output end).

In this case, the amplifying circuit 130 may include an operational amplifier OP2 and a plurality of resistors, and these resistors include two fourth resistors Ro11 and Ro12, and two fifth resistors Ro21 and Ro22.

A first end of the fourth resistor Ro11 is coupled to an output of the first digital-to-analog converter 122 and the first resistor Rm11, and a second end of the fourth resistor Ro11 is coupled to an input of the operational amplifier OP2 (such as a negative input end). The fourth resistor Ro11 receives the second-level audio data Van from the first digital-to-analog converter 122.

A first end of the fourth resistor Ro12 is coupled to the output of the first digital-to-analog converter 122 and the first resistor Rm12, and a second end of the fourth resistor Ro12 is coupled to the input of the operational amplifier OP2 (such as a positive input end). The fourth resistor Ro12 receives the first-level audio data Vap from the first digital-to-analog converter 122.

The fifth resistor Ro21 is coupled between the input of the operational amplifier OP2 (such as the negative input end) and the output of the operational amplifier OP2, and the fifth resistor Ro22 is coupled between the input of the operational amplifier OP2 (such as the positive input end) and the ground.

In an example, the fourth resistors Ro11 and Ro12 and the fifth resistors Ro21 and Ro22 have fixed values as required. Ratios of the resistance of the fifth resistors Ro21 and Ro22 to that of the fourth resistors Ro11 and Ro12 are approximately equal to ratios of the resistance of the second resistors Rm21 and Rm22 to that of the first resistors Rm11 and Rm12 respectively, that is, Rm21/Rm11=Ro21/Ro11, and Rm22/Rm12=Ro22/Ro12.

In some embodiments, the resistance of the third resistors Rm31 and Rm32 is greater than the resistance of the first resistors Rm11 and Rm12, and the resistance of the third resistors Rm31 and Rm32 is greater than the resistance of the second resistors Rm21 and Rm22.

In this case, the mixing circuit 140 performs a magnification adjustment and a summation operation on differential audio data (Vap−Van) and the audio signal Vo by adjusting the resistance ratio to generate a differential feedback signal (Vmp−Vmn). In other words, according to the first-level audio data Vap and the second-level audio data Van, the mixing circuit 140 eliminates the main-tone component in the audio signal Vo to generate even times of harmonic distortion in the audio signal Vo (that is, the differential feedback signal (Vmp−Vmn)). The analog-to-digital converter 150 converts the differential feedback signal (Vmp−Vmn) from the analog domain to the digital domain (that is, a feedback signal Sm in the digital domain) and the feeds back the feedback signal Sm in the digital domain to the audio control circuit 110. In this case, the feedback signal Sm in the digital domain can be recorded back by the audio control circuit 110 to adjust the external audio data. In other words, the feedback signal Sm in the digital domain does not contain a main-tone component and has harmonic distortion and/or noise contributed by an analog circuit (such as the amplifying circuit 130).

Figure 8:
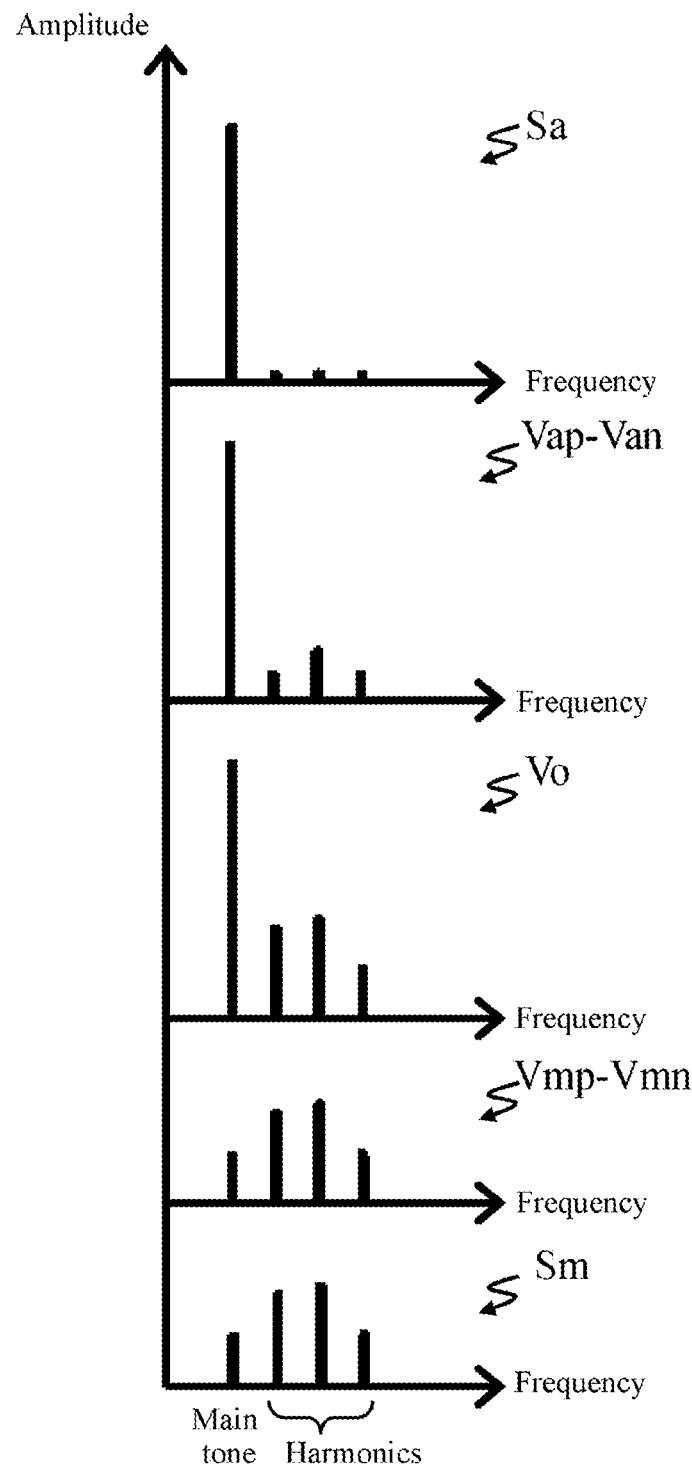
FIG. 8 is an energy relationship diagram of signals before feedback shown in FIG. 7.

In this example, an energy relationship between the audio data Sa in the digital domain, the audio data in the analog domain (the differential audio signal (Vap−Van)), the audio signal Vo, the feedback signal (the differential feedback signal (Vmp−Vmn)) in the analog domain, and the feedback signal Sm in the digital domain that are formed by the audio CODEC circuit without feedback can be obtained through fast Fourier transform (FFT) as shown in FIG. 8. Referring to FIG. 8, each of the audio data Sa, the differential audio signal (Vap−Van), the audio signal Vo, and the differential feedback signal (Vmp−Vmn) at least includes one main tone and a plurality of harmonics. In other words, the main-tone component is a fundamental frequency component.

Figure 9:
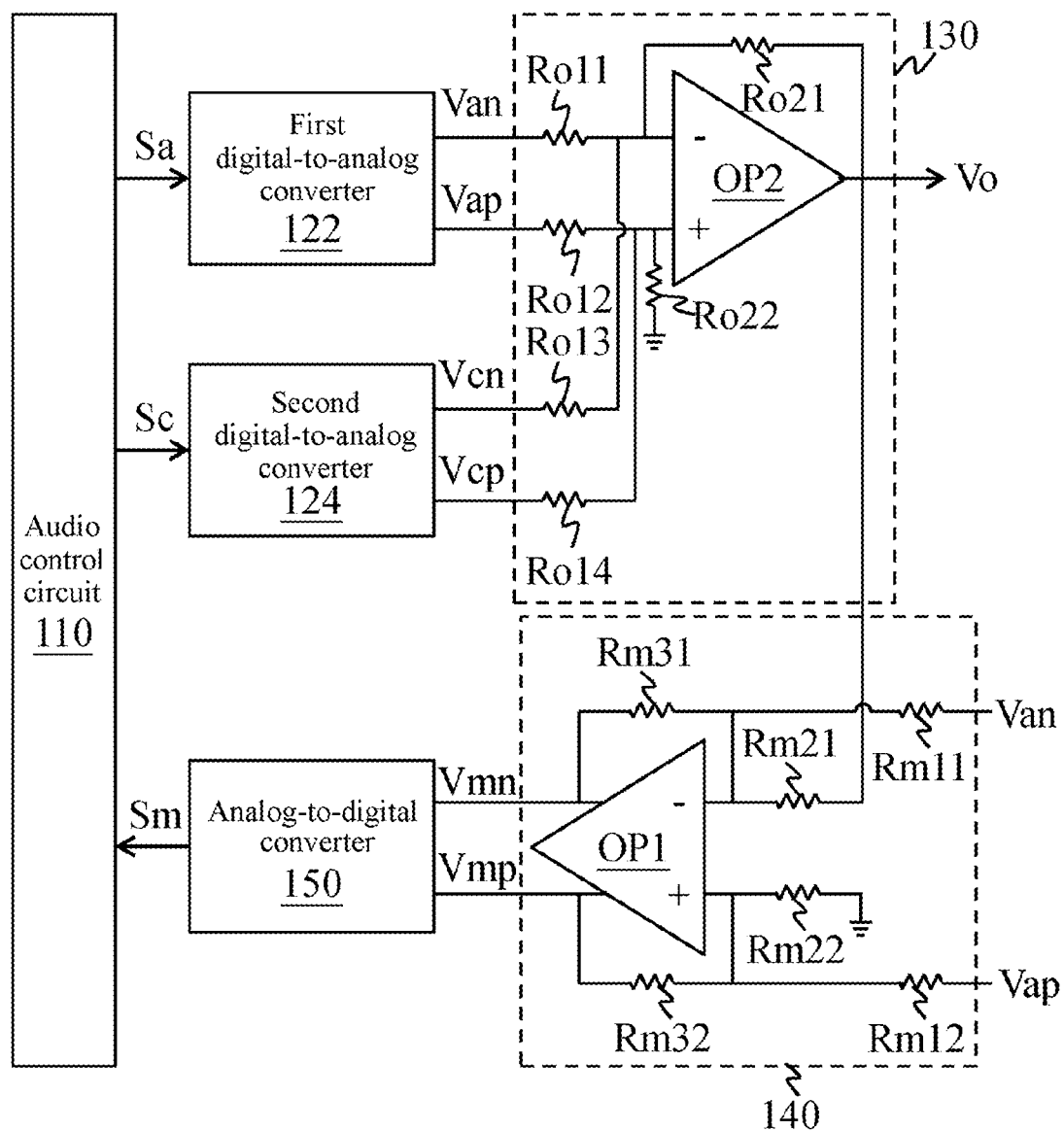
FIG. 9 is a circuit schematic diagram of an example of a mixing circuit.

In another example, referring to FIG. 9, when a digital-to-analog conversion circuit 120 includes a first digital-to-analog converter 122 and a second digital-to-analog converter 124, in addition to an operational amplifier OP2, two fourth resistors Ro11 and Ro12, and two fifth resistors Ro21 and Ro22, an amplifying circuit 130 may further include another two fourth resistors Ro13 and Ro14.

A first end of the fourth resistor Ro13 is coupled to an output of the second digital-to-analog converter 124, and a second end of the fourth resistor Ro13 is coupled to an input of the operational amplifier OP2 (such as a negative input end), the first end of the fourth resistor Ro11, and one end of the fifth resistor Ro21.

A first end of the fourth resistor Ro14 is coupled to the output of the second digital-to-analog converter 124, and a second end of the fourth resistor Ro14 is coupled to the input of the operational amplifier OP2 (such as a positive input end), the first end of the fourth resistor Ro12, and one end of the fifth resistor Ro22.

In this case, compensation data Vc includes first-level compensation data Vcp and second-level compensation data Vcn. The fourth resistor Ro13 receives the second-level compensation data Vcn from the first digital-to-analog converter 122. At the coupling of the fourth resistor Ro11 and the fourth resistor Ro13, after the second-level compensation data Vcn and the audio data Va in the analog domain are integrated, the integrated data is input to the input of the operational amplifier OP2 (such as the negative input end). The fourth resistor Ro14 receives the first-level compensation data Vcp from the first digital-to-analog converter 122. At the coupling of the fourth resistor Ro12 and the fourth resistor Ro14, after the first-level compensation data Vcp and the audio data Va in the analog domain are integrated, the integrated data is input to the input of the operational amplifier OP2 (such as the positive input end).

Figure 10:
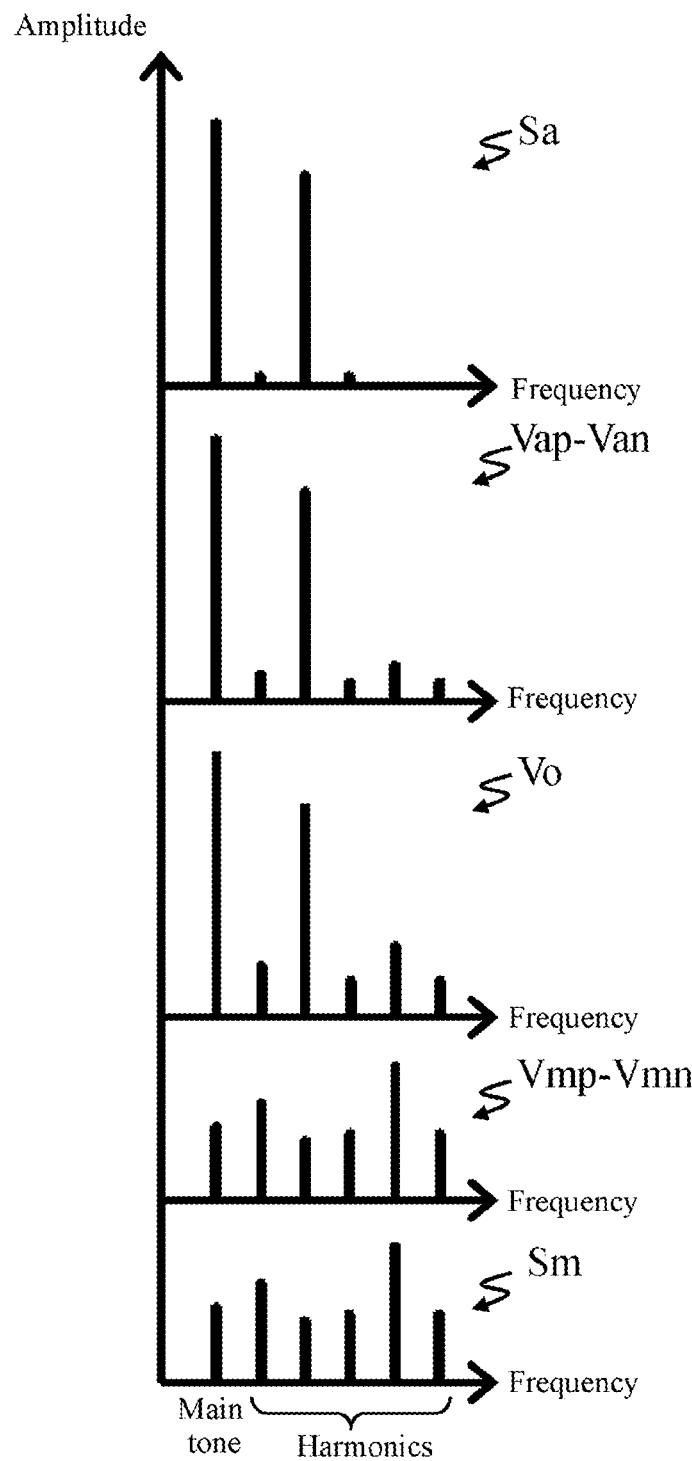
FIG. 10 is an energy relationship diagram of signals before feedback shown in FIG. 9.
Figure 11:
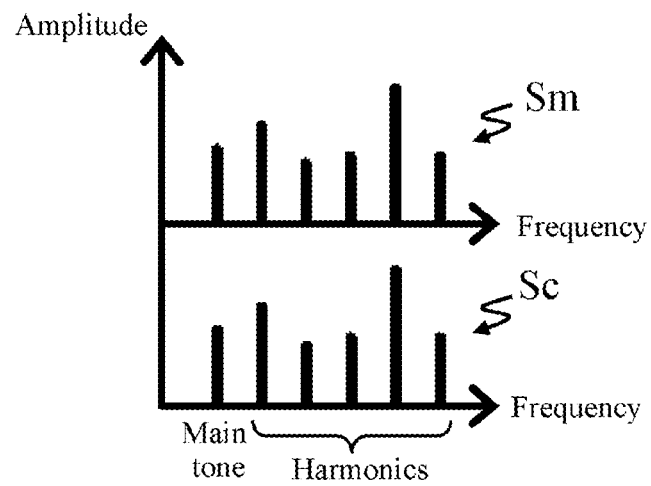
FIG. 11 is an energy relationship diagram of a feedback signal and a compensation signal shown in FIG. 9.
Figure 12:
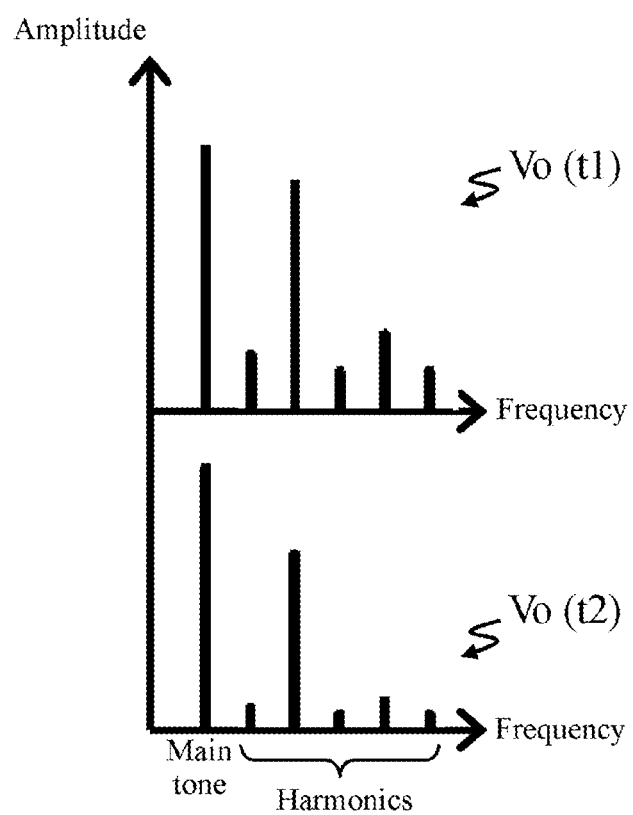
FIG. 12 is an energy relationship diagram of an output signal before feedback and after feedback shown in FIG. 9.

In this example, an energy relationship between the audio data Sa in the digital domain, the audio data in the analog domain (the differential audio signal (Vap−Van)), the audio signal Vo, the feedback signal (the differential feedback signal (Vmp−Vmn)) in the analog domain, and the feedback signal Sm in the digital domain that are formed by the audio CODEC circuit without feedback can be obtained through fast Fourier transform as shown in FIG. 10. Based on this, an energy relationship between the feedback signal Sm in the digital domain and the compensation data (the differential compensation data (Vcp−Vcn)) in the analog domain that are formed by the audio CODEC circuit can be obtained through fast Fourier transform as shown in FIG. 11. An energy relationship between audio signals Vo that are formed by the audio CODEC circuit at t1 before feedback and at t2 after feedback can be obtained as shown in FIG. 12.

Compared with the example shown in FIG. 7, in an example shown in FIG. 9, the audio CODEC circuit can suppress the noise greatly while correctly compensating for the harmonic distortion by adjusting the resistance ratio.

In an example, a feedback signal Vf includes a first-level feedback signal Vfp and a second-level feedback signal Vfn.

Figure 13:
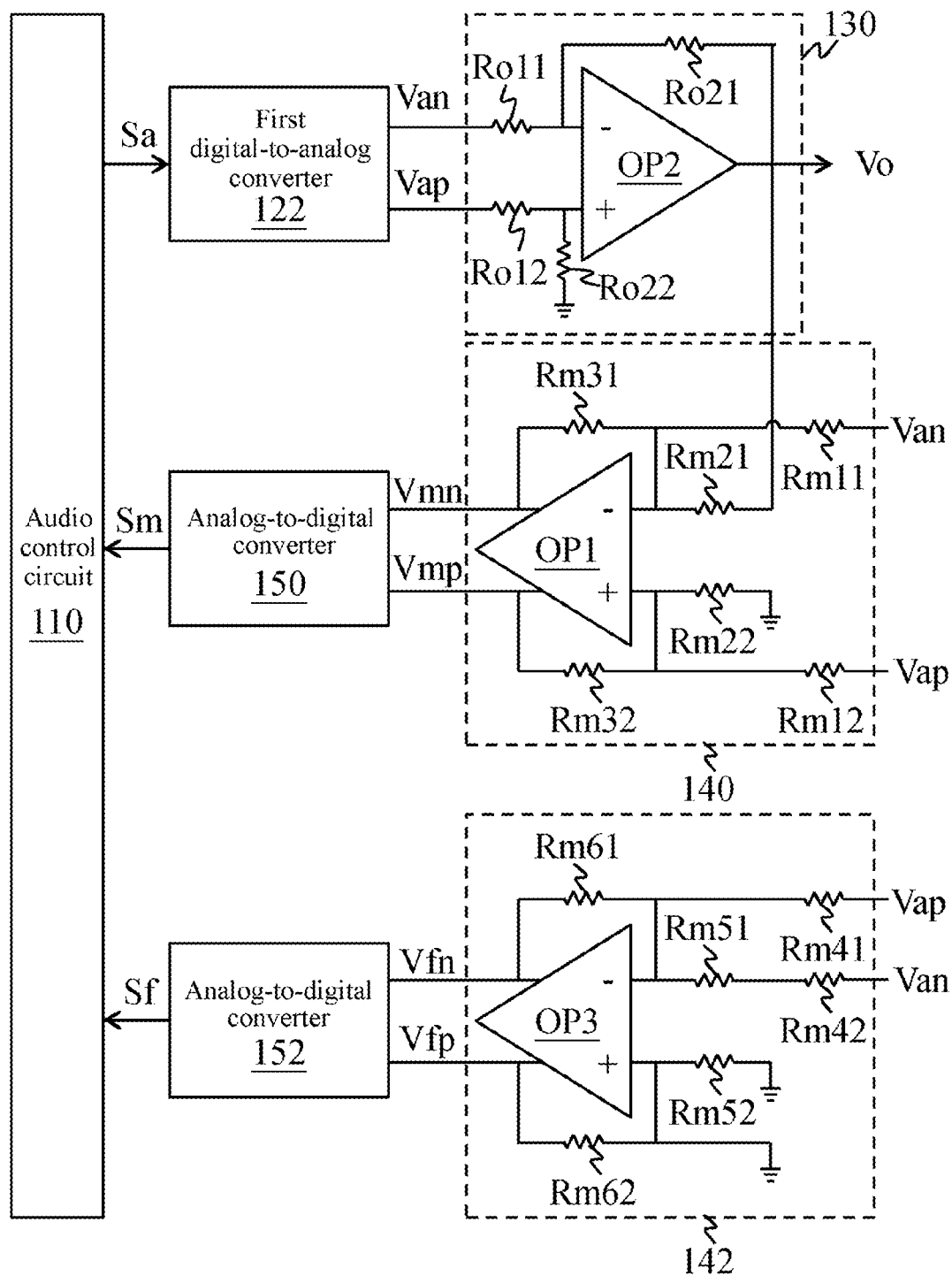
FIG. 13 is a circuit schematic diagram of an example of another mixing circuit.

Referring to FIG. 13, a mixing circuit 142 may include an operational amplifier OP3 and a plurality of resistors, and these resistors include two sixth resistors Rm41 and Rm42, two seventh resistors Rm51 and Rm52, and two eighth resistors Rm61 and Rm62.

The sixth resistor Rm41 is coupled between an output of a digital-to-analog conversion circuit 120 (a first digital-to-analog converter 122) and an input of the operational amplifier OP3 (such as a negative input end), and receives first-level audio data Vap from the first digital-to-analog converter 122. The sixth resistor Rm42 is coupled between the output of the digital-to-analog conversion circuit 120 (the first digital-to-analog converter 122) and the seventh resistor Rm51, and receives second-level audio data Van from the first digital-to-analog converter 122. The seventh resistor Rm51 is coupled between the seventh resistor Rm51 and an input of the operational amplifier OP3 (such as a positive input end), and the seventh resistor Rm52 is coupled between the input of the operational amplifier OP3 (such as the positive input end) and the ground. A first end of the eighth resistor Rm61 is coupled between an input of an operational amplifier OP1 (such as a negative input end), the sixth resistor Rm41, and the seventh resistor Rm51, and a second end of the eighth resistor Rm61 is coupled to an output of the operational amplifier OP3 (such as a negative output end). A first end of the eighth resistor Rm62 is coupled between the input of the operational amplifier OP3 (such as the positive input end) and the ground, and a second end of the eighth resistor Rm62 is coupled to an output of the operational amplifier OP3 (such as a positive output end).

In this case, the operational amplifier OP3 includes two output ends (hereinafter referred to as a first output end and a second output end). The first output end of the operational amplifier OP3 outputs a first-level feedback signal Vfp, and the second output end of the operational amplifier OP3 outputs a second-level feedback signal Vfn.

In this example, according to the first-level audio data Vap, the second-level audio data Van, and an audio signal Vo, a mixing circuit 140 outputs a differential feedback signal (Vmp−Vmn) to an analog-to-digital converter 152. In this case, according to the first-level audio data Vap and the second-level audio data Van, the mixing circuit 142 eliminates a main-tone component in the audio signal Vo to generate even times of harmonic distortion (that is, the differential feedback signal (Vmp−Vmn)) in the audio signal Vo. An analog-to-digital converter 150 converts the differential feedback signal (Vmp−Vmn) from the analog domain to the digital domain (that is, a feedback signal Sm in the digital domain) and feeds back the feedback signal Sm in the digital domain to an audio control circuit 110.

According to the first-level audio data Vap and the second-level audio data Van, the mixing circuit 142 outputs a differential feedback signal (Vfp−Vfn) to the analog-to-digital converter 152. In this case, according to the first-level audio data Vap and the second-level audio data Van, the mixing circuit 142 eliminates a main-tone component in differential audio data (Vap−Van) to generate even times of harmonic distortion in the differential audio data (Vap−Van) (that is, the differential feedback signal (Vfp−Vfn)). The analog-to-digital converter 152 converts the differential feedback signal (Vfp−Vfn) from the analog domain to the digital domain (that is, a feedback signal Sf in the digital domain), and feeds back the feedback signal Sf in the digital domain to the audio control circuit 110.

However, the audio control circuit 110 adjusts the received external audio data according to the feedback signals Sm and Sf, and further outputs the audio data Sa after adjustment to the digital-to-analog conversion circuit 120. In other words, the feedback signals Sm and Sf in the digital domain do not contain a main-tone component and have harmonic distortion and/or noise contributed by an analog circuit (such as the first digital-to-analog converter 122 and the amplifying circuit 130).

Based on the above, according to the audio CODEC circuit and the method for processing audio data of the present invention, a main-tone component in a signal is eliminated by using a technology for eliminating a main signal to feed back the harmonic distortion and/or noise in the signal, to adjust or compensate the audio data, thereby effectively guaranteeing the improvement in the sound quality.

What is claimed is:

1. A circuit, comprising:
  a digital-to-analog conversion circuit configured to receive and convert audio data in the digital domain and output the audio data in the analog domain, wherein the audio data includes a main-tone component;
  an amplifying circuit configured to output an audio signal according to the audio data in the analog domain;
  a mixing circuit configured to eliminate the main-tone component according to the audio data in the analog domain and the audio signal, and to output a feedback signal; and
  an analog-to-digital converter configured to convert the feedback signal from the analog domain to the digital domain.

2. The circuit according to claim 1, further comprising:
  an audio control circuit configured to provide the audio data in the digital domain to the digital-to-analog conversion circuit according to the feedback signal.

3. The circuit according to claim 1, further comprising:
  an audio control circuit configured to provide the audio data in the digital domain to the digital-to-analog conversion circuit and to provide compensation data in the digital domain to the digital-to-analog conversion circuit according to the feedback signal,
  wherein the digital-to-analog conversion circuit includes a first digital-to-analog converter and a second digital-to-analog converter, the first digital-to-analog converter converts the audio data in the digital domain to the analog domain, and the second digital-to-analog converter converts the compensation data in the digital domain to the analog domain; and
  wherein the amplifying circuit integrates the audio data in the analog domain and the compensation data in the analog domain and outputs the audio signal according to the integrated data.

4. The circuit according to claim 1, further comprising:
  another mixing circuit configured to eliminate the main-tone component according to the audio data in the analog domain and outputting another feedback signal; and
  another analog-to-digital converter configured to convert the another feedback signal from the analog domain to the digital domain, wherein the audio data in the digital domain is related to the feedback signal in the digital domain and the another feedback signal in the digital domain.

5. The circuit according to claim 1, wherein the mixing circuit is configured to perform a magnification adjustment and a summation operation on the audio data in the analog domain and the audio signal for generating the feedback signal.

6. The circuit according to claim 1, wherein the mixing circuit comprises:
- an operational amplifier;
- a first resistor, coupled between an input of the amplifying circuit and an input of the operational amplifier;
- a second resistor, coupled between an output of the amplifying circuit and the input of the operational amplifier; and
- a third resistor, coupled between the input of the operational amplifier and an output of the operational amplifier.

7. The circuit according to claim 6, wherein the resistance of the third resistor is greater than the resistance of the first resistor, and the resistance of the third resistor is greater than the resistance of the second resistor.

8. The circuit according to claim 6, wherein the amplifying circuit comprises:
- another operational amplifier;
- a fourth resistor, coupled between an output of the digital-to-analog conversion circuit and an input of the another operational amplifier; and
- a fifth resistor, coupled between the output of the digital-to-analog conversion circuit and an output of the another operational amplifier or coupled between an output of the first digital-to-analog converter and the ground.

9. The circuit according to claim 8, wherein the resistance of the fourth resistor and the resistance of the fifth resistor are fixed values, and a ratio of the resistance of the fifth resistor to the resistance of the fourth resistor is equal to a ratio of the resistance of the second resistor to the resistance of the first resistor.

10. The circuit according to claim 8, further comprising:
- another mixing circuit configured to eliminate the main-tone component according to the audio data in the analog domain and outputting another feedback signal; and
- another analog-to-digital converter configured to convert the another feedback signal from the analog domain to the digital domain, wherein the audio data in the digital domain is related to the feedback signal in the digital domain and the another feedback signal in the digital domain.

11. The circuit according to claim 1, wherein a gain of the mixing circuit is related to a gain of the amplifying circuit.

12. The circuit according to claim 1, wherein the main-tone component is a fundamental frequency component.

13. A method for processing audio data, comprising:
- converting audio data in the digital domain to audio data in the analog domain, wherein the audio data comprises a main-tone component;
- outputting an audio signal according to the audio data in the analog domain;
- eliminating the main-tone component according to the audio data in the analog domain and the audio signal to output a feedback signal; and
- converting the feedback signal from the analog domain to the digital domain.

14. The method for processing audio data according to claim 13, further comprising:
- providing the audio data in the digital domain according to the feedback signal.

15. The method for processing audio data according to claim 13, further comprising:
- providing compensation data in the digital domain according to the feedback signal; and
- converting the compensation data in the digital domain to the analog domain,
- wherein a step of generating the audio signal according to the audio data comprises:
- integrating the audio data in the analog domain and the compensation data in the analog domain and outputting the audio signal according to the integrated data.

16. The method for processing audio data according to claim 13, wherein a gain in the step of eliminating the main-tone component according to the audio data in the analog domain and the audio signal to output a feedback signal is related to a gain in the step of outputting the audio signal according to the audio data in the analog domain.

17. The method for processing audio data according to claim 13, further comprising:
- eliminating the main-tone component according to the audio data in the analog domain to output another feedback signal; and
- converting the another feedback signal from the analog domain to the digital domain.

18. The method for processing audio data according to claim 17, further comprising:
- providing the audio data in the digital domain according to the feedback signal and the another feedback signal.

19. The method for processing audio data according to claim 13, wherein the main-tone component is a fundamental frequency component.

* * * * *